United States Patent
Kim et al.

(10) Patent No.: US 8,153,509 B2
(45) Date of Patent: Apr. 10, 2012

(54) METHOD OF FABRICATING LIGHT EMITTING DIODE USING LASER LIFT-OFF TECHNIQUE AND LASER LIFT-OFF APPARATUS HAVING HEATER

(75) Inventors: Chang Youn Kim, Ansan-si (KR); Joon Hee Lee, Ansan-si (KR); Jong Kyun You, Ansan-si (KR); Hwa Mok Kim, Ansan-si (KR)

(73) Assignee: Seoul Opto Device Co., ltd., Ansan-si (KR)

( * ) Notice: Subject to any disclaimer, the term of this patent is extended or adjusted under 35 U.S.C. 154(b) by 152 days.

(21) Appl. No.: 12/693,907

(22) Filed: Jan. 26, 2010

(65) Prior Publication Data
US 2011/0053302 A1    Mar. 3, 2011

(30) Foreign Application Priority Data

Aug. 26, 2009 (KR) .................. 10-2009-0079430
Aug. 26, 2009 (KR) .................. 10-2009-0079438

(51) Int. Cl.
*H01L 21/329* (2006.01)
*H01L 33/02* (2010.01)
*H01L 21/428* (2006.01)

(52) U.S. Cl. ........... 438/458; 438/33; 438/463; 438/481
(58) Field of Classification Search .................... 438/41
See application file for complete search history.

(56) References Cited

U.S. PATENT DOCUMENTS 7,998,836 B1 *   8/2011  Shiomi et al. ................. 438/458
2004/0110395 A1 * 6/2004 Ueda et al. ..................... 438/795

* cited by examiner

*Primary Examiner* — Zandra Smith
*Assistant Examiner* — Pamela E Perkins
(74) *Attorney, Agent, or Firm* — H.C. Park & Associates, PLC

(57) ABSTRACT

Disclosed is a method of fabricating a light emitting diode using a laser lift-off apparatus. The method includes growing an epitaxial layer including a first conductive-type compound semiconductor layer, an active layer and a second conductive-type compound semiconductor layer on a first substrate, bonding a second substrate, having a different thermal expansion coefficient from that of the first substrate, to the epitaxial layers at a first temperature of the first substrate higher than a room temperature, and separating the first substrate from the epitaxial layer by irradiating a laser beam through the first substrate at a second temperature of the first substrate higher than the room temperature but not more than the first temperature. Thus, during a laser lift-off process, focusing of the laser beam can be easily achieved and the epitaxial layers are prevented from cracking or fracture. The laser lift-off process is performed by a laser lift-off apparatus including a heater.

10 Claims, 4 Drawing Sheets

METHOD OF FABRICATING LIGHT EMITTING DIODE USING LASER LIFT-OFF TECHNIQUE AND LASER LIFT-OFF APPARATUS HAVING HEATER

CROSS-REFERENCE TO RELATED APPLICATIONS

This application claims priority from and the benefit of Korean Patent Application No. 10-2009-0079430, filed on Aug. 26, 2009, and Korean Patent Application No. 10-2009-0079438, filed on Aug. 26, 2009, which are hereby incorporated by reference for all purposes as if fully set forth herein.

BACKGROUND OF THE INVENTION

1. Field of the Invention

Exemplary embodiments of the present invention relate to a fabrication method of light emitting diode and a laser lift-off apparatus for manufacturing the light emitting diode and, more particularly, to a method for fabricating a light emitting diode using a laser lift-off is apparatus including a heater.

2. Discussion of the Background

In recent years, good thermal stability and direct transition type energy band of group III-based nitrides, such as gallium nitride GaN, and aluminum nitride AlN have been adopted as one of the group III-based nitride material for manufacturing light emitting diodes in the range of visible light and UV light. Typically, InGaN-based blue and green light emitting diodes have been utilized for various types of applications such as large natural color flat display panels, traffic signals, interior lightings, high density light sources, high resolution output systems, and optical communication systems.

A group III-based nitride semiconductor layer is grown on a heterogeneous substrate having a similar crystal structure to the semiconductor layer by using a metal organic chemical vapor deposition (MOCVD) or a molecular beam epitaxy (MBE) due to difficulty in growing a homogeneous substrate that permits growth of the semiconductor layer thereon. For example, a sapphire substrate with the hexagonal structure is generally used as the heterogeneous substrate. However, since sapphire is an electrical insulator, the using of the sapphire can cause to limit a structure of light emitting diodes. Thus, recent studies have focused on to grow epitaxial layers including nitride semiconductor layers on a heterogeneous substrate such as a sapphire substrate, followed by a process of lifting-off the heterogeneous substrate from the epitaxial layers in which a vertical structure type light emitting diode can be manufactured.

As for an approach of lifting-off the heterogeneous substrate, a laser lift-off technique is generally applied. According to a conventional lift-off technique, if a second substrate is a homogeneous substrate to the sapphire substrate or has a similar coefficient of thermal expansion to that of the sapphire substrate, the conventional lift-off technique, irradiating the sapphire substrate by laser beam, can be performed without significant problems. However, if the second substrate has a different coefficient of thermal expansion from that of the sapphire substrate, the conventional lift-off technique often causes cracking or fracture of epitaxial layers during separation of the sapphire substrate.

Furthermore, the difference in thermal coefficient between the second substrate and the sapphire substrate often causes bowing of the sapphire substrate after the second substrate is bonded to the epitaxial layers. The bowing of the sapphire substrate causes the laser beam to be out of focus thereby making it difficult to accurately transfer energy of the laser beam to an interface between the sapphire substrate and the epitaxial layer.

Therefore, there is a need for an approach to prevent the epitaxial layers from cracking, fracturing and bending during a process associated with a lift-off technique.

SUMMARY OF THE INVENTION

These and other needs are addressed by the present invention, in which exemplary embodiments provide a method for fabricating a light emitting diode capable of prevent cracking or fracture of epitaxial layers during separation of a substrate using a laser lift-off technique.

Additional features of the invention will be set forth in the description which follows, and in part will be apparent from the description, or may be learned by practice of the invention.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

Exemplary embodiments of the present invention disclose a method of making a light emitting diode. The method includes growing an epitaxial layer on a first substrate, the epitaxial layer comprising a first conductive-type compound semiconductor layer, an active layer, and a second conductive-type compound semiconductor layer. The method also includes bonding a second substrate, having a different thermal expansion coefficient from that of the first substrate, to the epitaxial layer at a first temperature of the first substrate higher than a room temperature. The method includes separating the first substrate from the epitaxial layer by irradiating a laser beam through the first substrate at a second temperature of the first substrate higher than the room temperature but not more than or approximately equal to the first temperature.

Exemplary embodiments of the present invention disclose a laser lift-off apparatus. The apparatus includes a laser oscillator to emit a laser beam. The apparatus also includes a stage to support a work piece. The method includes a heater to generate heating the work piece.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further is understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

A method for fabricating a light emitting diode and a laser lift-off apparatus are disclosed. In the following description, for the purposes of explanation, numerous specific details are set forth in order to provide a thorough understanding of the present invention. It is apparent, however, to one skilled in the art that the present invention may be practiced without these specific details or with an equivalent arrangement. In other instances, well-known structures and devices are shown in block diagram form in order to avoid unnecessarily obscuring the present invention.

FIG. 1, FIG. 2, FIG. 3, FIG. 4 and FIG. 5 illustrate respective processes in a method of fabricating a light emitting diode using a laser lift-off apparatus in accordance with exemplary embodiments of the present disclosure.

Figure 1:
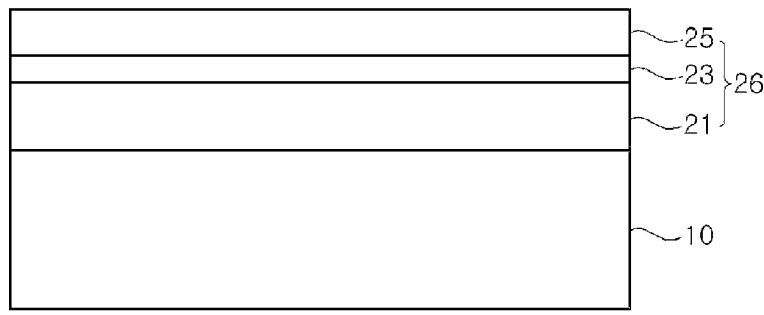
FIG. 1, FIG. 2, FIG. 3, FIG. 4 and FIG. 5 are schematic cross-sectional views showing respective processes for fabricating a light emitting diode in accordance with exemplary embodiments of the present invention.

Referring to FIG. 1, epitaxial layers 26 may include a first conductive-type compound semiconductor layer 21, an active layer 23 and a second conductive-type compound semiconductor layer 25 that may be formed on a first substrate 10. The first substrate 10 may be a growth substrate, for example, a sapphire substrate, on which the epitaxial layers 16 can be grown.

The epitaxial layers 26 may be gallium nitride-based compound semiconductors grown on the first substrate 10 by a metal-organic chemical vapor deposition (MOCVD) or a molecular beam epitaxy (MBE). In some examples, the epitaxial layers 26 may include a buffer layer (not shown) provided to relieve lattice mismatch between the first substrate 10 and the epitaxial layers 26 grown thereon. Further, the active layer 23 may have a single or multi-quantum well structure. The first and second conductive-type compound semiconductors may be n-type and p-type semiconductors or p-type and p-type semiconductors, respectively.

The epitaxial layers 26 may be formed to have a total thickness less than approximately 10 μm. The total thickness of the epitaxial layers 26 may relatively smaller than the thickness of the first substrate 10 that can be used as the growth substrate. For example, since the first substrate 10 may have a thickness of approximately 100 μm or more, the thickness of the epitaxial layers 26 may not exceed about 1/10th of the thickness of the first substrate 10. As such, the epitaxial layers 26 may be formed to have a total thickness less than approximately 10 μm, thereby relatively may reduce a stress applied from the epitaxial layers 26 to the first substrate 10.

The epitaxial layers 26 may be grown in a vacuum chamber. After the growth of the epitaxial layers 26, the first substrate 10 having the epitaxial layers 26 thereon may be taken out of the chamber for a subsequent process.

Figure 2:
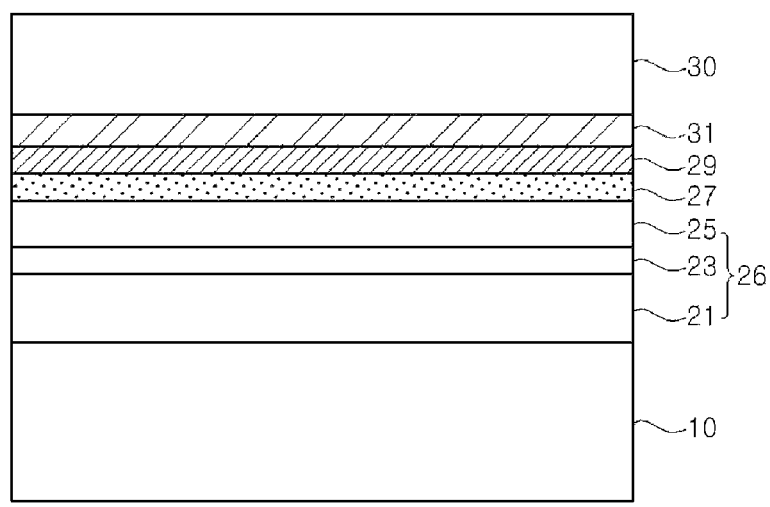

Referring to FIG. 2, a second substrate 30 may be bonded to the uppermost layer of the epitaxial layers 26, for example, the second conductive-type compound semiconductor layer 25. The second substrate 30, variously being selected based on the characteristic of using thereof in consideration of such as a heat conduction and an electric conduction, may be a silicon substrate or a metal substrate as an example. In some examples, when fabricating a vertical light emitting diode, the second substrate 30 may be a conductive substrate. The second substrate 30 generally may have a different coefficient of thermal expansion than that of the first substrate 10.

The second substrate 30 may be bonded to the epitaxial layers 26 by eutectic bonding of a bonding metal 31. The bonding metal 31 may be AuSn, which may have a melting point of about 330° C. A bonding metal having a higher melting point than that of AuSn may also be used. After the bonding metal 31 is formed on one side of the epitaxial layers 26 and on the opposite side of the second substrate 30, the bonding metal 31 may be heated to, for example, about 300° C. to cause eutectic bonding such that the second substrate 30 can be bonded to the epitaxial layers 26.

Before forming the bonding metal 31, a reflective layer 27 and a diffusion barrier layer 29 may be formed on the epitaxial layers 26. The reflective layer 27 may enhance light output by reflecting light that can be generated from the active layer 23 and may travel toward the second substrate 30. The reflective layer 27 may be in ohmic contact with the second conductive-type semiconductor layer 25. The reflective layer 27 may be formed one of the is group of Al, Ag, Ni, Ph, Pd, Pt, or Ru and a combination alloy based on the group. The diffusion barrier layer 29 may prevent deterioration of reflectivity of the reflective layer 27, which can be caused by diffusion of the bonding metal 31 into the reflective layer 27.

Figure 3:
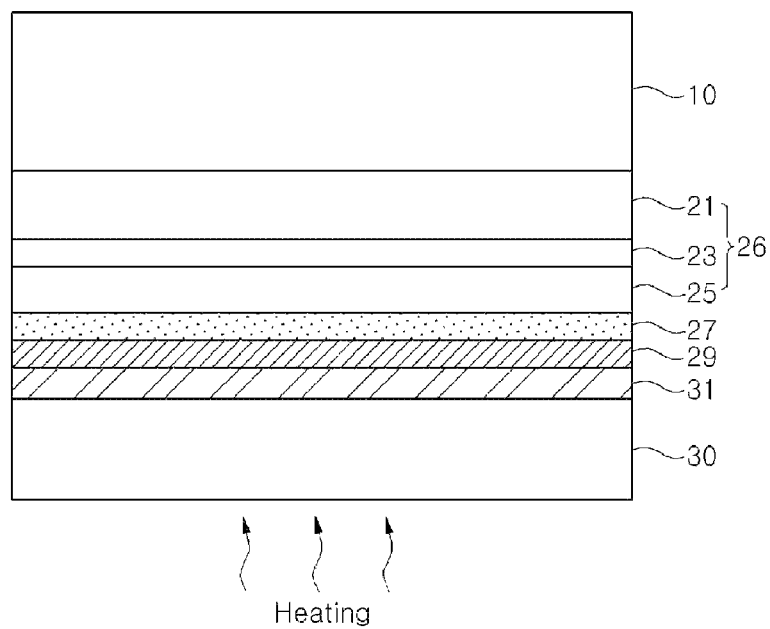

Referring to FIG. 3, subsequent to bonding process of the second substrate 30, the first substrate 10 and the second substrate 30 may be cooled to room temperature. Then, the first substrate 10 may be placed in a laser lift-off apparatus to separate the first substrate 10.

Prior to laser irradiation, the first substrate 10 may be heated above room temperature. In this example, considering the melting point of the bonding metal, the temperature of the first substrate 10, that is, the second temperature, may not exceed the first temperature, that is, the eutectic temperature. If the second temperature exceeds the first temperature, the epitaxial layers 26 can be fractured due to an excessive thermal expansion of the bonding metal. Therefore, if the bonding metal 31 is, for example, AuSn, the first substrate 10 may be heated to a temperature of about 300° C. or less, preferably in the range of about 200~300° C.

The first substrate 10 may be heated in a laser lift-off apparatus capable of providing a heating means, that is, a heater, as described below. Alternatively, after being heated outside a laser lift-off apparatus, the first substrate 10 may be shifted into the laser lift-off apparatus prior to being cooled to a room temperature.

Figure 4:
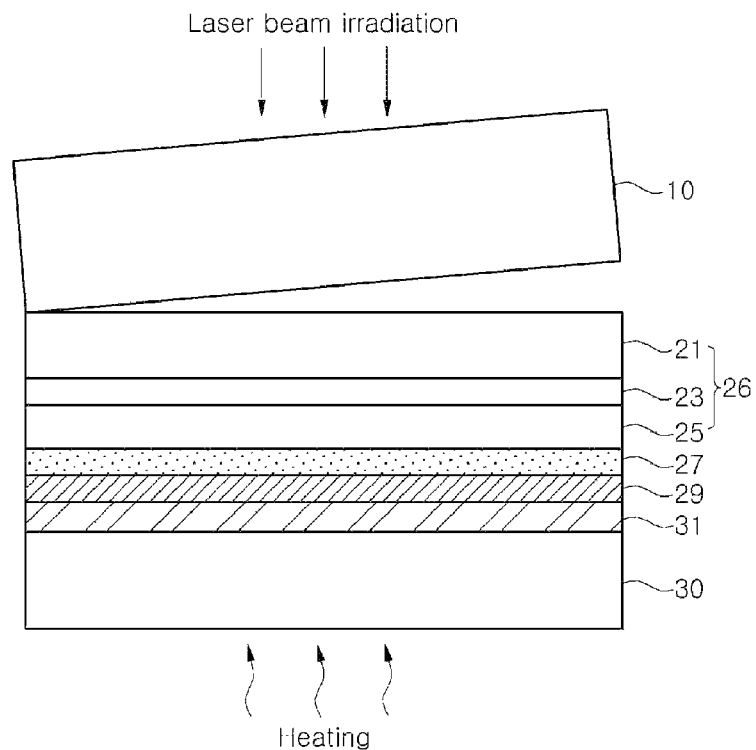

Referring to FIG. 4, a laser beam can be irradiated through the first substrate 10 to separate the first substrate 10 from the epitaxial layers 26. In this example, the temperature of the first substrate 10 may higher than a room temperature and may not exceed the first temperature. Accordingly, a stress applied to the first substrate 10 or second substrate 30 due to the difference in coefficient of a thermal expansion between the first and second substrates 10, 30 may be relieved or minimized. As a result, bowing (e.g., bending) of the first substrate 10 can be relieved that allows to facilitate focusing of the laser beam, and the epitaxial layers 26 can be prevented from cracking or fracturing suffered during partial separation process of the first substrate 10.

Figure 5:
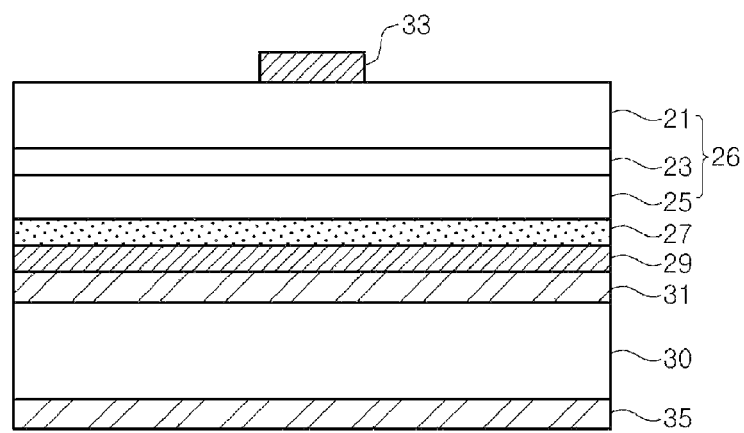

Referring to FIG. 5, subsequent to separation process of the first substrate 10, an electrode pad 33 may be formed on an exposed surface of the first conductive-type compound semiconductor layer 21, and an electrode pad 35 may be formed on the second substrate 30. Then, the epitaxial layers 26 including the second substrate 30 can be divided into individual light emitting diodes to fabricate vertical structure type light emitting diodes.

In some examples, the first substrate 10 can be described as being heated prior to the laser irradiation. Alternatively, subsequent to the second substrate 30 bonding to the epitaxial layers 26, the first substrate 10 may be shifted into the laser lift-off apparatus while being cooled, and may then be separated from the epitaxial layers 26 by irradiating the laser beam thereto.

In some examples, although the second substrate 30 may be described as being bonded to the epitaxial layers 26 via the bonding metal 31, the second substrate 30 may also be bonded thereto by other techniques.

Figure 6:
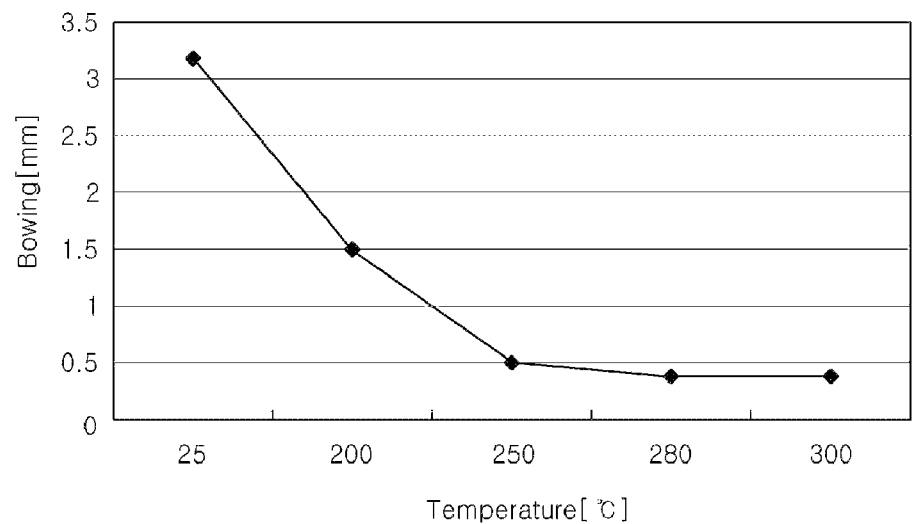
FIG. 6 is a graph depicting measured bowing of a first substrate based on a heating temperature subsequent to bonding a second substrate.

FIG. 6 is a graph depicting measured bowing of the second substrate 30 based on a heating temperature subsequent to the second substrate 30 bonding to the epitaxial layers 26. In this example, the first substrate 10 may be an approximately 2-inch sapphire substrate and the second substrate 30 may be a silicon substrate and may be bonded to the epitaxial layers 26 at approximately 300° C. by AuSn-eutectic bonding. For example, a degree of bowing can be an average value obtained by measuring the height of respective edges of the second substrate 30 with a wafer placed on a flat surface to allow the second substrate 30 to contact the flat surface.

Referring to FIG. 6, subsequent to the second substrate 30 bonding to the epitaxial layers, the degree of bowing reaches about 3.2 mm at a room temperature. As the wafer is heated, the degree of bowing can be lowered. At approximately 200° C., the degree of bowing can be lowered below approximately ½ of the bowing degree at a room temperature, and at approximately 250° C., the degree of bowing can be lowered to approximately 0.5 mm or less and may not further significantly be lowered even by an additional heating.

Accordingly, it can be seen that subsequent to the second substrate 30 bonding to the epitaxial layers, the bowing of the first substrate 10 can be relieved by heating the first substrate 10. The above example can be obtained using the approximately 2-inch sapphire substrate, and the degree of bowing can be expected to linearly increase in proportion to the size of the sapphire substrate.

In the example of FIG. 6, it is contemplated that, when the 2-inch sapphire substrate is used as the first substrate 10, the first substrate 10 may be heated to a temperature at which the degree of bowing becomes at least approximately 3 mm or less, preferably approximately 1.5 mm or less.

Figure 7:
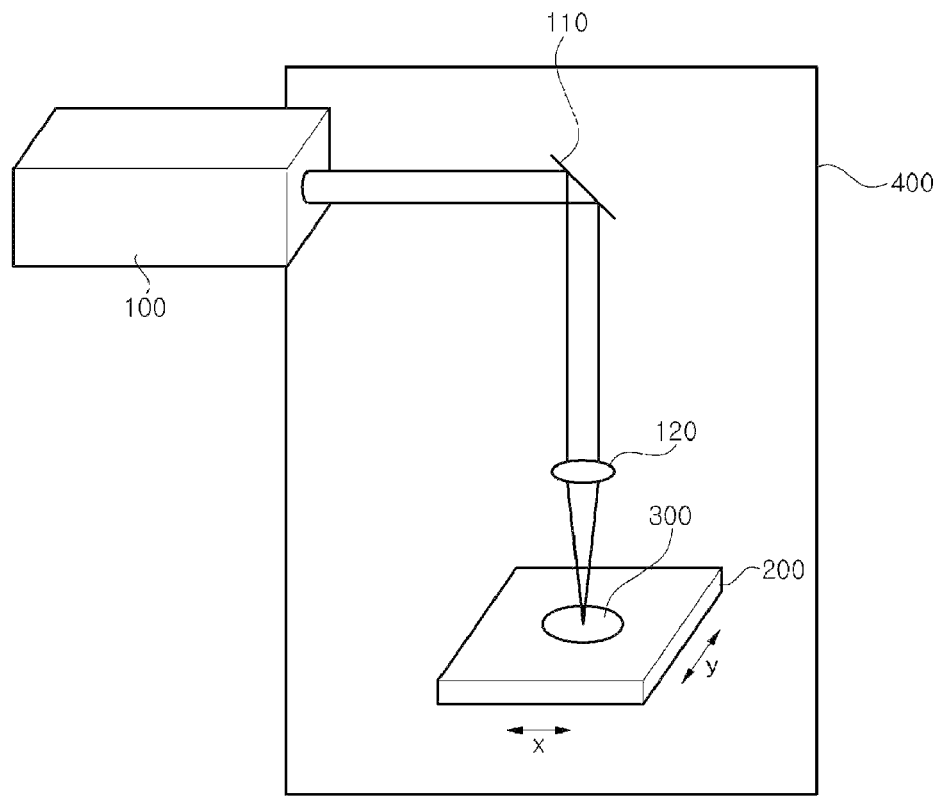
FIG. 7 is a schematic view of a laser lift-off apparatus in accordance with exemplary embodiments of the present invention.

FIG. 7 is a schematic view of a laser lift-off apparatus in accordance with exemplary embodiments of the present invention.

Referring to FIG. 7, the laser lift-off apparatus may include a laser oscillator 100 provided to oscillate a laser beam, a mirror 110 provided to change a traveling direction of the laser beam, an optical lens 120 provided to focus the laser beam, and a stage 200 provided to support a work piece, that is, a wafer 300, provided as an irradiation target of the laser beam. The apparatus may include a housing 400 that has a laser beam path defined therein to maintain the path in a vacuum.

The laser oscillator 100 may be a KrF or an ArF excimer laser. A beam emitted from the laser oscillator 100 can be reflected by the mirror 110 and changed in a traveling direction. The apparatus may include a plurality of mirrors 110 to change the traveling direction of the laser beam. The optical lens 120 can be located above the stage 200 and can focus the laser beam irradiating the wafer 300.

The stage 200 may be moved in the x (e.g., horizontal)-direction and/or y (vertical)-direction based on a substrate of a wafer by a shifting device (not shown) so that the wafer 300 thereon may also be moved. The wafer 300 may include a first substrate 10, epitaxial layers 26 grown on the first substrate 10, and a second substrate 30 bonded to the epitaxial layers 26. A laser beam may irradiate through the first substrate 10 and the laser bean can be absorbed mainly by an interface between the first substrate 10 and the epitaxial layers 26. The laser beam may be irradiated in the form of a spot beam and may scan across the wafer 300 by movement of the wafer 300.

Further, the stage 200 may include a heater, which can be used to heat the wafer 300 prior to or during the laser irradiation.

Figure 8:
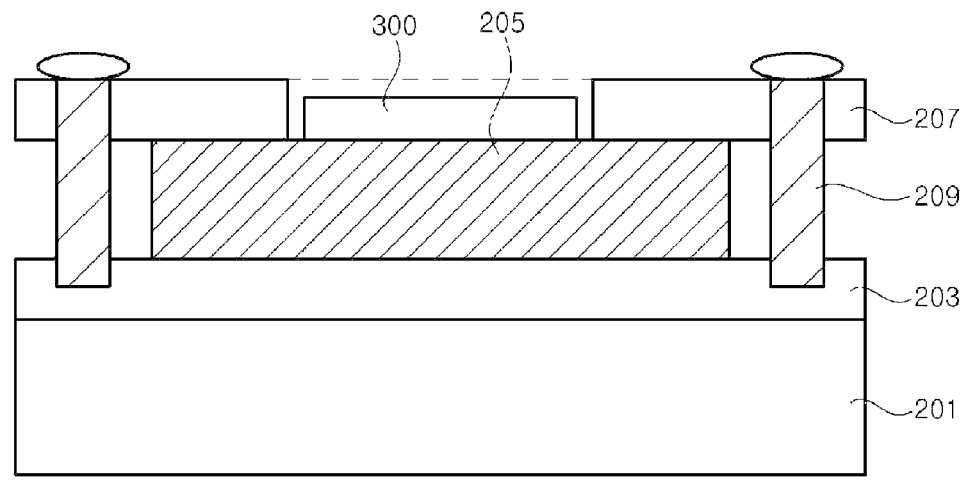
FIG. 8 is a cross-sectional view of a resistance heater in accordance with exemplary embodiments of the present invention.

FIG. 8 is a cross-sectional view of a stage including a resistance heater as a heater in accordance with exemplary embodiments of the present invention.

Referring to FIG. 8, the stage 200 may include a main stage 201, a resistance heater 205, an insulator 203, a heater securing plate 207, and securing pins 209. The main stage 201 may support the resistance heater 205 and the wafer 300 and may serve to move the wafer 300 in the x-direction and/or y-direction by the shifting device.

The resistance heater 205 may generate a resistance heat using an electric power from a power source. The resistance heat may be transferred from the resistance heater 205 to the work piece 300 to contact the resistance heater 205 such that the work piece 300 can be heated by the resistance heat.

The insulator 203 may insulate the main stage 201 from the resistance heater 205 and may shield heat transfer from the resistance heater 205 to the main stage 201 to improve heat efficiency. The insulator 203 may be made of, for example, ceramics or plastics, and may be secured to the main stage 201.

The heater securing plate 207 may be disposed on the heater 205 to secure the resistance heater 205 between the main stage 201 and the heater securing plate 207. The heater securing plate 207 may be secured to the main stage 201 or the insulator 203 by securing screws or securing pins 209. The heater securing plate 207 and the securing pins 209 may also be made of ceramics or plastics.

In some examples, the resistance heater 205 can be described as being disposed on the main stage 201, but it may also be disposed inside the main stage 201.

It is contemplated that since the wafer 300 can be heated using the resistance heater 205, wafer bowing may be relieved by heating the work piece 300 prior to and/or during the laser irradiation process.

Figure 9:
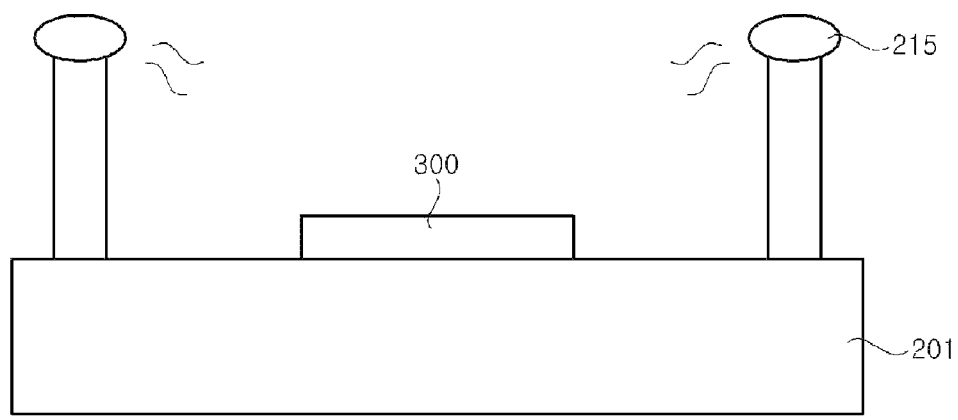
FIG. 9 is a cross-sectional view of an infrared (IR) lamp or a heat gun in accordance with exemplary embodiments of the present invention.

FIG. 9 is a cross-sectional view of an IR lamp or a heat gun as a heater in accordance with exemplary embodiments of the present invention.

Referring to FIG. 9, a heater such as an IR lamp or a heat gun may be disposed above the main stage 201. The IR lamp may heat the wafer 300 on the main stage 201 by emitting infrared light thereto, and the heat gun may heat the wafer 300 by forcible convection of resistance heat.

In some examples, some types of heaters for heating the wafer are described, but various other heaters may also be used to heat the wafer by heat conduction, convection and/or radiation.

For example, during separation of a growth substrate by implementing the laser lift-off apparatus, bowing of the growth substrate can be relieved to facilitate focusing of a laser beam and to prevent common cracking or fracturing problem in epitaxial layers. Further, the growth substrate may be heated using the heater of the laser lift-off apparatus.

The present disclosure may directed to solving the problems of the conventional technique as described above, and an exemplary approach including a method of fabricating a light emitting diode, which can prevent cracking or fracture in epitaxial layers during separation of a substrate using a laser lift-off technique.

By way of examples, a method of fabricating a light emitting diode, which can relieve bowing of a growth substrate to facilitate focusing of a laser beam during separation of a substrate using a laser lift-off technique.

Exemplary embodiments include a laser lift-off apparatus capable of preventing cracking or fracture in epitaxial layers during separation of a substrate using a laser lift-off technique.

According to exemplary embodiments, a laser lift-off apparatus capable of minimizing bowing of a growth substrate may be provided to facilitate focusing of a laser beam during separation of a substrate using a laser lift-off technique.

In accordance with exemplary embodiments, a method of fabricating a light emitting diode using a laser lift-off technique may be provided. The method may includes growing epitaxial layers on a first substrate, the epitaxial layers including a first conductive-type compound semiconductor layer, an active layer and a second conductive-type compound semiconductor layer; bonding a second substrate having a different thermal expansion coefficient from that of the first substrate to the top of the epitaxial layers at a first temperature of the first substrate higher than a room temperature; and separating the first substrate from the epitaxial layers by irradiating a laser beam through the first substrate at a second temperature of the first substrate higher than the room temperature but not more than the first temperature.

In a conventional laser lift-off technique, after the second substrate is bonded at the first temperature, the first substrate is cooled to a room temperature and then separated from the epitaxial layers by irradiating a laser beam through the first substrate. Here, the difference in thermal expansion coefficient between the first substrate and the second substrate may cause bowing of the first substrate and the epitaxial layers are susceptible to cracking or fracturing during separation of the first substrate by irradiating the laser beam.

On the contrary, according to exemplary embodiments of the invention, the laser beam is irradiated at the second temperature of the first substrate higher than a room temperature. Therefore, with the bowing of the first substrate relieved, the first substrate can be separated from the epitaxial layers, thereby preventing the epitaxial layer from cracking or fracturing.

Meanwhile, the first substrate can be heated to the second temperature prior to irradiating the laser beam. For example, subsequent to the second substrate bonding to the top of the epitaxial layers, the first substrate may be first cooled to a room temperature. The first substrate may be heated to the second temperature by a heater. Additionally, during irradiation of the laser beam, the first substrate may be heated and maintained at the second temperature. Alternatively, subsequent the second substrate bonding to the epitaxial layers at the first temperature, the laser beam may be irradiated through the first substrate prior to the first substrate is cooled to room temperature.

Heating of the first substrate may be performed using a heat conduction, a convection or a radiation. For example, a resistance heater, an IR lamp and/or a heat gun may be used to heat the first substrate. These heaters may be located inside a laser lift-off apparatus.

If the first substrate is approximately 2-inch sapphire substrate, the second temperature may be a temperature at which an average value of bowing of the first substrate is not more than about 3 mm. The second temperature may be a temperature at which an average value of bowing of the first substrate is not more than about 1.5 mm.

The second substrate may be bonded to the epitaxial layers through, although not limited to, eutectic bonding of a bonding metal. Here, the bonding metal may be AuSn. In this example, the second temperature may be in the range of about 200~300° C.

According to exemplary embodiments of the present invention, the total thickness of the epitaxial layers does not exceed about 10 μm. Such a total thickness of the epitaxial layers is a relatively much smaller thickness which does not exceed about ⅒th the thickness of the first and second substrates. Accordingly, substrate bowing caused by the difference in thermal expansion coefficient between the epitaxial layers and the first substrate may be so insignificant as to be ignored.

In accordance with exemplary embodiments, a laser lift-off apparatus including a heater may be provided. The apparatus may include a laser oscillator to emit a laser beam, a stage to support a work piece, and a heater to generate heating the work piece.

The work piece may include a first substrate, epitaxial layers grown on the first substrate, and a second substrate bonded to the epitaxial layers.

According to exemplary embodiments, the first substrate may be heated using the heater. Therefore, with the bowing of the first substrate relieved, a laser beam can be irradiated through the first substrate, thereby preventing generation of cracking or fracture in the epitaxial layers.

In one embodiment, the heater may be a resistance heater. Further, the stage may include a movable main stage and the resistance heater may be disposed on the main stage. Alternatively, the resistance heater may be disposed inside the main stage.

The stage may further include an insulator between the main stage and the resistance heater, a heater securing plate located on the resistance heater, and securing pins securing the heater securing plate. The insulator, the heater securing plate and/or the securing pins may be made of ceramics or plastics. The insulator, the heater securing plate and/or the securing pins may be made of the same material.

In some examples, the heater may be an IR lamp or a heat gun.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

The invention claimed is:
1. A method for making a light emitting diode, comprising:
   growing an epitaxial layer on a first substrate, the epitaxial layer comprising a first conductive-type compound semiconductor layer, an active layer, and a second conductive-type compound semiconductor layer;
   bonding a second substrate, having a different thermal expansion coefficient from that of the first substrate, to the epitaxial layer at a first temperature of the first sub- strate higher than a room temperature, wherein the second substrate is bonded to the epitaxial layer by metal eutectic bonding; and separating the first substrate from the epitaxial layer by irradiating a laser beam through the first substrate at a second temperature of the first substrate higher than the room temperature but not more than the first temperature.

2. The method according to claim 1, further comprising:
heating the first substrate to the second temperature prior to irradiating the laser beam.

3. The method according to claim 2, wherein the first substrate is heated to maintain the second temperature during irradiation of the laser beam.

4. The method according to claim 2, wherein the heating of the first substrate is performed using a heater provided in a laser lift-off apparatus.

5. The method according to claim 1, wherein the first substrate is approximately 2-inch sapphire substrate and the second temperature is an average temperature to cause bowing of the first substrate in the range of about 3 mm or less.

6. The method according to claim 1, wherein the first substrate is approximately 2-inch sapphire substrate and the second temperature is an average temperature to cause bowing of the first substrate in the range of about 1.5 mm or less.

7. The method according to claim 1, wherein the metal eutectic bonding is AuSn.

8. The method according to claim 1, wherein the second temperature is in the range of about 200~300° C.

9. The method according to claim 1, wherein irradiation of the laser beam is performed during the first substrate cooling subsequent to the second substrate bonding to the epitaxial layers.

10. The method according to claim 1, wherein a total thickness of the epitaxial layers is less than approximately 10 μm.

* * * * *